United States Patent [19]

Nakayama et al.

[11] Patent Number: 5,541,003
[45] Date of Patent: Jul. 30, 1996

[54] ARTICLES HAVING DIAMOND-LIKE PROTECTIVE THIN FILM

[75] Inventors: Masatoshi Nakayama; Masanori Shibahara, both of Saku, Japan

[73] Assignee: TDK Corporation, Tokyo, Japan

[21] Appl. No.: 209,337

[22] Filed: Mar. 10, 1994

Related U.S. Application Data

[63] Continuation-in-part of Ser. No. 961,223, Oct. 15, 1992, abandoned.

[30] Foreign Application Priority Data

Oct. 31, 1991 [JP] Japan .................. 3-311487
Oct. 31, 1991 [JP] Japan .................. 3-311488

[51] Int. Cl.⁶ ............................................. B32B 9/00
[52] U.S. Cl. .................. 428/408; 428/216; 428/469; 428/446
[58] Field of Search ............................ 428/408, 336, 428/446, 697, 698, 216, 469

[56] References Cited

U.S. PATENT DOCUMENTS

| | | | |
|---|---|---|---|
| 4,647,494 | 3/1987 | Meyerson et al. | 428/408 |
| 5,008,002 | 4/1991 | Uno et al. | 427/133 |
| 5,045,165 | 9/1991 | Yamashita | 204/192.16 |
| 5,159,508 | 10/1992 | Grill et al. | 310/103 |
| 5,175,658 | 12/1992 | Chang et al. | 360/103 |
| 5,198,285 | 3/1993 | Arai et al. | 428/408 |

FOREIGN PATENT DOCUMENTS 63-277593 11/1988 Japan .
63-307196 12/1988 Japan .

OTHER PUBLICATIONS

Oguri et al "Low friction coatings of diamond–like carbon with silicon prepared by plasma–assisted chemical vapor deposition" J. Mater Res vol. 5, No. 11, Nov. 1990 pp. 2567–2571.
TRC News, Jan. 1987, vol. 6–1, p. 7 published by Torey Research Center and translation.
Journal of Applied Physics of Japan, vol. 55, No. 7 (1986), p. 640 and translation.

Primary Examiner—A. A. Turner
Attorney, Agent, or Firm—Sprung Horn Kramer & Woods

[57] ABSTRACT

Articles protectively coated with a diamond-like thin film firmly bonded to the substrates are obtained by forming an intermediate layer composed of an amorphous mixture of silicon and carbon on a substrate of a material which has only a slight affinity for such a diamond-like thin film, and forming a diamond-like thin film further thereon.

9 Claims, 2 Drawing Sheets

ARTICLES HAVING DIAMOND-LIKE PROTECTIVE THIN FILM

This application is a continuation-in-part application of application Ser. No. 07/961,223, filed Oct. 15, 1992 and now abandoned.

BACKGROUND OF THE INVENTION

This invention relates to a technique of improving the adhesion or binding properties of a diamond-like thin film with respect to slightly adhesive substrates of articles, such as metallic mold substrates.

"Diamond-like film" or "diamond-like thin film" used herein is defined as an amorphous carbon film having a Raman's absorption at about 1,550 $cm^{-1}$. It should be noted that the diamond-like film is clearly different from diamond film because the latter has a sharp Raman's absorption peak at 1,333 $cm^{-1}$ and is an aggregate of micro crystals. Diamond-like film does not have Raman's absorption peak 1,333 $cm^{-1}$ and usually such diamond-like film or diamond-like thin film has a Vickers hardness Hv of at least 5,000 $kg/mm^2$ (refer, e.g., to TRC News, January 1987, Vol. 6-1, page 7, published by Torey Research Center and Journal of Applied Physics of Japan, Vol. 55, No. 7 (1986), page 640).

Methods of manufacturing diamond-like thin films by the vapor phase process are varied (refer, e.g., to HYOMEN KAGAKU (Surface Chemistry), vol. 5, No. 108 (1984), pp. 108–115 "Various methods"). Diamond-like thin films are extensively used as corrosion- and abrasion-resistant protective films over the surfaces of variously shaped articles that need to be protected.

The diamond-like thin films are capable of being bound solidly to substrates of silicon or the like. However, they are not as adhesive to certain types of article substrates and have a common problem of easily coming off from those substrate surfaces upon subjection to external forces. The shortcoming makes the films unable to be fully effective as protective coatings for applications where corrosion resistance or wear resistance is of essential importance. In particular, Fe metals and alloys (e.g., soft steel "STC", stainless steel, and hardened steels "SKD", "SKS"), alloys of other metals such as Co and Ni, glass, and ceramics are known to produce weak bonds between themselves and diamond-like thin films. Iron-based substrates, such as structural and sliding parts, are of the highest industrial utility. Glass and ceramics too have a broad range of applications including sliding members of thermal heads. It is therefore important to improve the adhesiveness of diamond-like thin films to these substrate surfaces on which they are to be formed.

Pretreatment of such substrates has been taught, e.g., by Japanese Patent Application Public Disclosure Nos. 200898/1985, 204695/1985, and 174376/1986.

The molds or dies for injection molding, extrusion, compression molding, etc. of glass and plastics have hitherto been made from cemented carbides. The materials are expensive and require much time and cost to procure and fabricate into the objects. Susceptibility to cracking due to the lack of toughness is another disadvantage. The brittleness of the cemented carbides has to be compensated for and their abrasion resistance be enhanced. To this end, it has been proposed to coat the frictional or sliding surfaces of metallic molds protectively with diamond-like thin films, e.g., by Japanese Patent Application Public Disclosure Nos. 15169/1990, 22012/1990, and 15170/1990. However, the diamond-like thin films do not bind firmly enough to the metallic mold substrate surfaces and, being aggregates of microcrystals, they easily separate from the mold surfaces by dint of external forces. They, therefore, have not proved fully satisfactory as protective coatings for applications where resistance to corrosion and abrasion is essential.

Hardened steels, on the other hand, are available at lower cost and do not require much time and cost for fabrication but the resulting mold surfaces are worn faster and hence have shorter life. The drawback could be overcome by coating the surfaces with a diamond-like thin film formed by a vapor phase process, as proposed, e.g., by the above-mentioned Patent Application Public Disclosure Nos. 15169/1990, 22012/1990, and 15170/1990. However, by the same token, the binding force is insufficient. There are other approaches to the manufacture of diamond-like thin films (refer, e.g., to HYOMEN KAGAKU (Surface Chemistry), vol. 5, No. 108 (1984), pp. 108–115 "Various methods"). Those methods generally require as high a substrate temperatures as 600° C. or upwards, which can anneal the hardened steels and impair the hardness of the resulting molds.

Patent Application Public Disclosure No. 200898/1985 recommends ion etching of a Co-WC alloy substrate surface by direct action of glow discharge before a diamond-like thin film is formed on the surface as a high-hardness film. Since no accelerating voltage is applied, the etching efficiency is not adequately high for the purpose of enhancing the adhesion. Thus the improvement in adhesion to which the present invention is directed is not satisfactorily achieved. Patent Application Public Disclosure No. 204695/1985 likewise aims at an increase in the film-forming rate. The end is attained by introducing Ar gas into a reduced-pressure chamber, applying a voltage across positive and negative electrodes to produce a plasma, and then subjecting a substrate to the plasma action. The plasma ion concentration being low, the etching effect is rather limited for the improvement of adhesion. Public Disclosure No. 174376/1986 intends to improve the adhesion of substrates by treatment with plasma gas and then by oxidation treatment to form an oxide coating. The plasma requires diffusion in the first place so that the positive ions can pass through the positive-potential grid. This makes it impossible for a sufficient amount of positive ions to form a film to reach the substrate, thereby rendering the process inefficient. The prior art methods thus have failed to produce a diamond-like thin film with adequately high bond between the film and the substrate. Patent Application Public Disclosure No. 80190/1991 teaches bombardment of a substrate surface with an accelerated ion beam. The technique is advantageous over those described already but is still unable to bring an adequately enhanced adhesion.

Patent Application Public Disclosure No. 174508/1984 sets out the ionization evaporation technique that is utilized in the present invention. The reference specification describes that a thin film of Si, Ti or the like is formed as an intermediate layer over a basis metal plate of Ni, Cu, Fe, Co or the like, and then a diamond-like film is formed thereover to provide a Vickers hardness of about 5000. However, the bases of bulk materials such as iron and steel that contain Fe, Co, etc. and stainless steel are not adequately receptive to the application of the coatings, and the coating film of Si or the like does not achieve satisfactory adhesion strength.

U.S. Pat. No. 4,753,414 (to McCandless) uses RF plasma in forming a carbonaceous coating film over a base. According to a paper written by the inventor and cited in the patent specification, the RF plasma method produced a Vickers hardness of only about 1850. The patent process, therefore, is unable to yield the diamond-like film of the present invention. In addition, the same patent is silent on any intermediate layer.

On the other hand, U.S. Pat. No. 5,112,025 claims that a diamond film can be directly formed on a plating film of Ni, with allegedly ample adhesion. However, the fact is the adhesion is "ample" in the sense that the plating film is capable of withstanding a molding pressure of at most about 400 kg/cm$^2$. Apart from this, Ni is originally a hardly adherent metal.

U.S. Pat. No. 4,490,229 (to Mirtish) teaches activating a base by bombardment with neutral Ar to increase the adhesion of a diamond-like film to the base surface. In the absence of accelerating means for the bombarding gas, however, the activation of the base surface is not sufficient for attaining full adhesion, and hence the hardness is unsatisfactory.

None of these printed publications of the prior art suggest that the use of an amorphous Si-C mixture as an intermediate layer makes it possible to form an excellently adherent and hard diamond-like film on a bulk metal such as stainless steel or steel containing Fe, Co, etc.

In view of the above, we proposed in Patent Application 142678/1991 the use of an Mo intermediate layer for added adhesiveness. The intermediate layer was found to produce very great binding power. We tried other substances for the intermediate layer and attained results comparable to or even better than those of the patent application.

It is therefore an object of the present invention to provide articles protected with a diamond-like thin film which is strongly bound to and highly adhesive to the substrate and exhibits improved peeling resistance and durability.

Another object of the invention is to manufacture highly wear-resistant metallic molds from inexpensive hardened steel. Hardened steel has such low thermal resistance and poor adhesion to diamond-like thin films that they have been unable to lend themselves to the industrial manufacture of diamond-coated metallic molds with adequate wear resistance. Patent Application No. 214913/1989 discloses a technique of forming a diamond-like film by bombardment of a substrate with Ar ions or the like and subsequent ionization evaporation to provide protection for metals and ceramics. It does not teach, however, the application of the technique to the fabrication of metallic molds from hardened steel.

SUMMARY OF THE INVENTION

The invention provides protectively coated articles comprising: a substrate selected from the group consisting of alloys containing at least Co, Ni, or Fe, ceramics, and glass and which has a slight affinity for a diamond-like thin film, e.g., the substrate of a metallic mold of hardened steel; an intermediate layer of an amorphous mixture of silicon and carbon, and a diamond-like thin film formed as the outer layer.

DETAILED DESCRIPTION OF THE INVENTION

Figure 1:
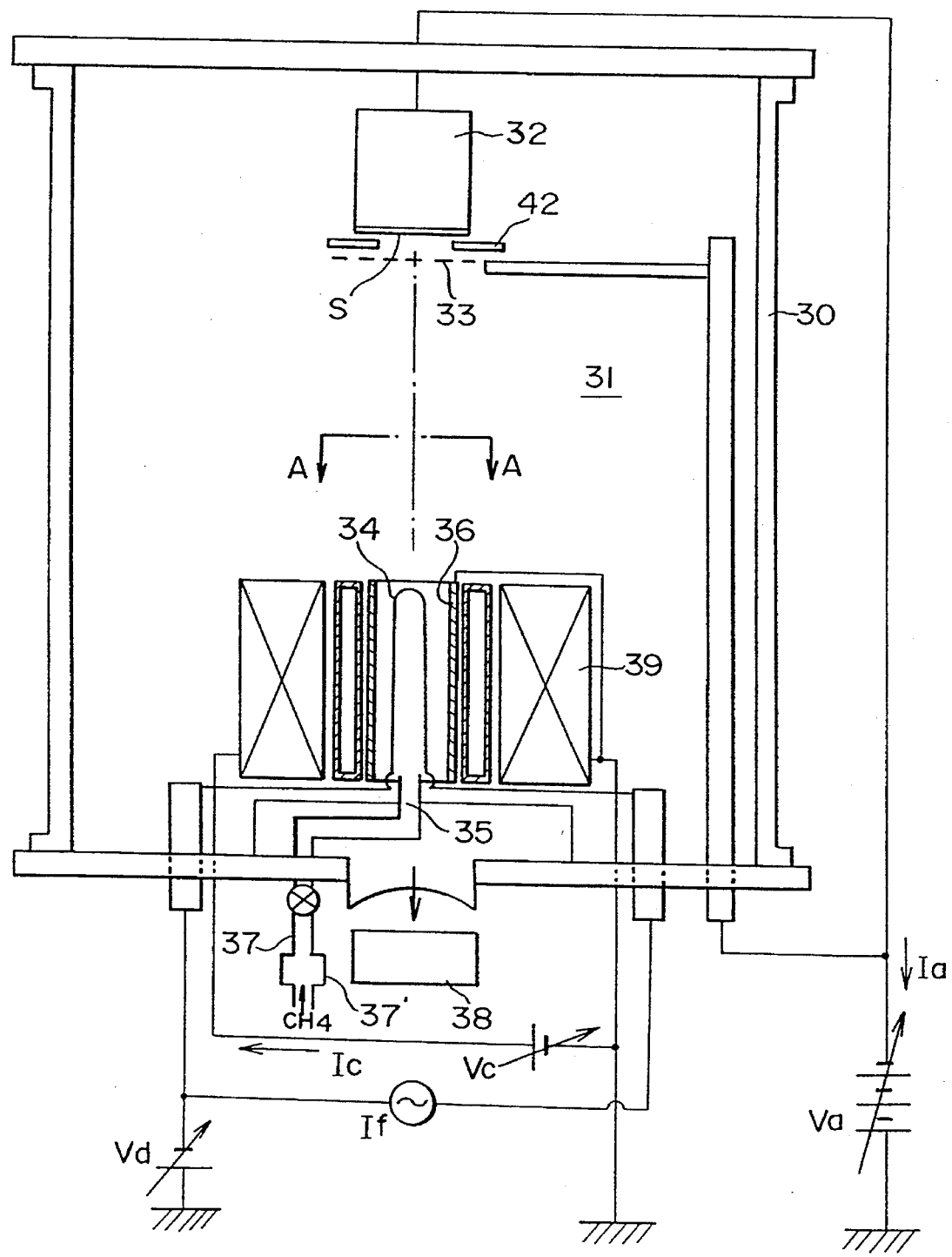
FIG. 1 is a schematic view, in vertical section, of an ionization evaporation apparatus for use in the present invention.

The material of the intermediate layer to be used under the invention is an amorphous mixture derived from the three material gases mentioned below. The gases are: (1) the gas of a low-molecular-weight compound which contains both carbon and silicon or a mixed gas of low-molecular-weight substances (2) and (3), (1) and (2), (1) and (3), or (1), (2), and (3). To support a diamond-like thin film, the intermediate layer too must have adequate hardness.

(1) Organosilicon compound: Methylsilane $CH_3SiH_3$, dimethylsilane $(CH_3)_2SiH_2$, trimethylsilane $(CH_3)_3SiH$, or tetramethylsilane $Si(CH_3)_4$.

(2) Silicon compound: Silane $SiH_4$, disilane $Si_2H_6$, or silicon tetrafluoride $SiF_4$.

(3) Carbon compound: Methane $CH_4$, ethane $C_2H_6$, propylene $C_3H_8$, ethylene $C_2H_4$, or acetylene $C_2H_2$.

For the formation of the intermediate layer, the bias-applied plasma chemical vapor deposition (CVD) method described in Patent Application No. 14480/1990 or ionization evaporation described in Patent Application Public Disclosure Nos. 174507/1983 or 234396/1989 may be utilized. It is desirable that the formation of the intermediate layer be immediately followed by that of a diamond-like thin film without exposing the intermediate layer to air. For this reason it is important to use the same vacuum vessel. The process is preferably preceded by a pretreatment in which the substrate is placed in a vacuum chamber of the film-forming apparatus, a bombarding gas, such as of At, is introduced into the chamber and is ionized by ionization means comprising a thermionic cathode filament unit and a counter cathode disposed around the unit, and the resulting ion stream is accelerated by a grid at a lower potential than the counter electrode to bombard and activate the substrate surface.

The resulting intermediate layer is not crystalline but amorphous. As will be compared later, it produces a greater binding force than that by the crystalline layer. In forming the intermediate layer it is recommended to use a large silicon content initially and reduce the content and increase the carbon content instead as the film thickens. In this way the binding force is further increased. The thickness of the intermediate layer is desirably between 0.02 and 3 μm, more desirably between 0.05 and 0.5 μm. A too thin layer is not effective but a too thick layer produces no more favorable effect.

To form an intermediate layer by the ionization evaporation or bias-applied CVD technique, either the singular or mixed gas is used. To form a diamond-like thin film, the ionization evaporation process is used which comprises ionizing a hydrocarbon feed gas or a feed gas capable of giving a hydrocarbon upon decomposition or reaction by ionization means, such as arc discharge between a thermionic cathode filament unit and a counter cathode or thermionic emission between a thermionic cathode filament unit and a counter cathode, and accelerating the resulting ion beam with an electric field and directing it toward a substrate to form a diamond-like thin film thereon. (The term "hydrocarbon" as used herein means a saturated hydrocarbon, such as methane, ethane, or propane, or an unsaturated hydrocarbon, such as ethylene, propylene, or acetylene, etc. The "feed gas capable of giving a hydrocarbon upon decomposition" is, e.g., an alcohol, such as methyl alcohol or ethyl alcohol, or a ketone, such as acetone or methyl ethyl ketone. The "feed gas capable of giving a hydrocarbon upon reaction" is, e.g., carbon monoxide or a mixed gas of carbon dioxide and hydrogen. Such a feed gas may contain at least one chosen from among rare gases, such as helium, neon, and argon, or from among hydrogen, oxygen, nitrogen, water, carbon monoxide, carbon dioxide, etc.) The details of the process are described in Patent Application Public Disclosure Nos. 174507/1983 and 234396/1989.

There is shown in FIG. 1 a preferred embodiment of an apparatus for forming both an intermediate layer and a diamond-like thin film. The numeral 30 designates a vacuum vessel and 31 a chamber communicated with an evacuation system 38 to be evacuated up to a high vacuum of about $10^{-6}$ Torr. An electrode 32 is located at the back of a substrate S and kept at a negative potential Va. A mask 42 is provided close to or in contact with the front surface of the substrate S, with a window for controlling the size and shape of the diamond-like thin film to be formed. While the mask may be in contact with the substrate, it is preferably located away from the latter so as to reduce the peripheral thickness of the film and decrease the risk of cracking. Indicated at 33 is a grid supplied with the same negative potential Va as for the substrate so as to be used in accelerating the hydrocarbon ions during the film-forming process. To enhance the continuity of the film and smoothen its surface, the grid 33 to be used has a properly chosen porosity (the total area of openings per unit area) and opening density (the number of openings per unit length). It may be equipped with means for causing planar vibrations. A thermionic cathode filament unit 34, kept at a negative potential Vd, is heated by a current If from an AC source to emit thermions. The numeral 35 indicates an inlet for the feed gas, 37 a gas feed passage, and 37' a plasma excitation chamber. An anode 36 surrounds the filament unit 34. The anode, while being grounded in this case, maintains a voltage Vd positive to the filament unit and is given a positive potential Va for the electrode 32 and grid 33. A solenoid 39 is disposed around the filament unit 34, anode 36, and feed inlet 35 so as to be excited by a current Ic from a power supply Vc to produce a magnetic field for the containment of ionized gas. Thus, the quality of the film being formed can be modified by adjusting If, Va, Vd, and the solenoid current Ic.

The film-forming procedure is as follows. The vacuum chamber 31 is evacuated to about $10^{-6}$ Torr and a valve on the gas feed line 37 is manipulated to admit a gas for forming an intermediate layer or a gas for forming a diamond-like film, or, in some cases, its mixture with hydrogen gas, or with Ar, He, Ne, or other carrier gas, all at predetermined rates, into the chamber through the inlet 35. With concurrent adjustment of the evacuation system 38, a desired gas pressure, e.g., $10^{-1}$ Torr, is secured. Meanwhile, the plurality of thermionic cathode filaments 34 are heated by passage of the AC current If, and the differential potential Vd is applied between the filament unit 34 and the anode 36 to produce a discharge. Feed gas fed via the inlet 35 is thermally decomposed and collides with the thermions from the filaments to give positive ions and electrons. The electrons, in turn, collide with other thermally decomposed particles. This phenomenon is repeated under the containment action by the magnetic field of the solenoid until the feed gas is totally converted to positive ions of the thermally decomposed substance. The positive ions are attracted by the negative potential Va applied to the electrode 32 and the grid 36 and are accelerated toward the substrate S. They thus impinge on the substrate and, through a film-forming reaction, produces a diamond-like thin film thereon.

As for the potential, current, temperature and other conditions for the parts involved, refer to the above-given data and also to the printed publications of the above-cited patent applications.

Figure 2:
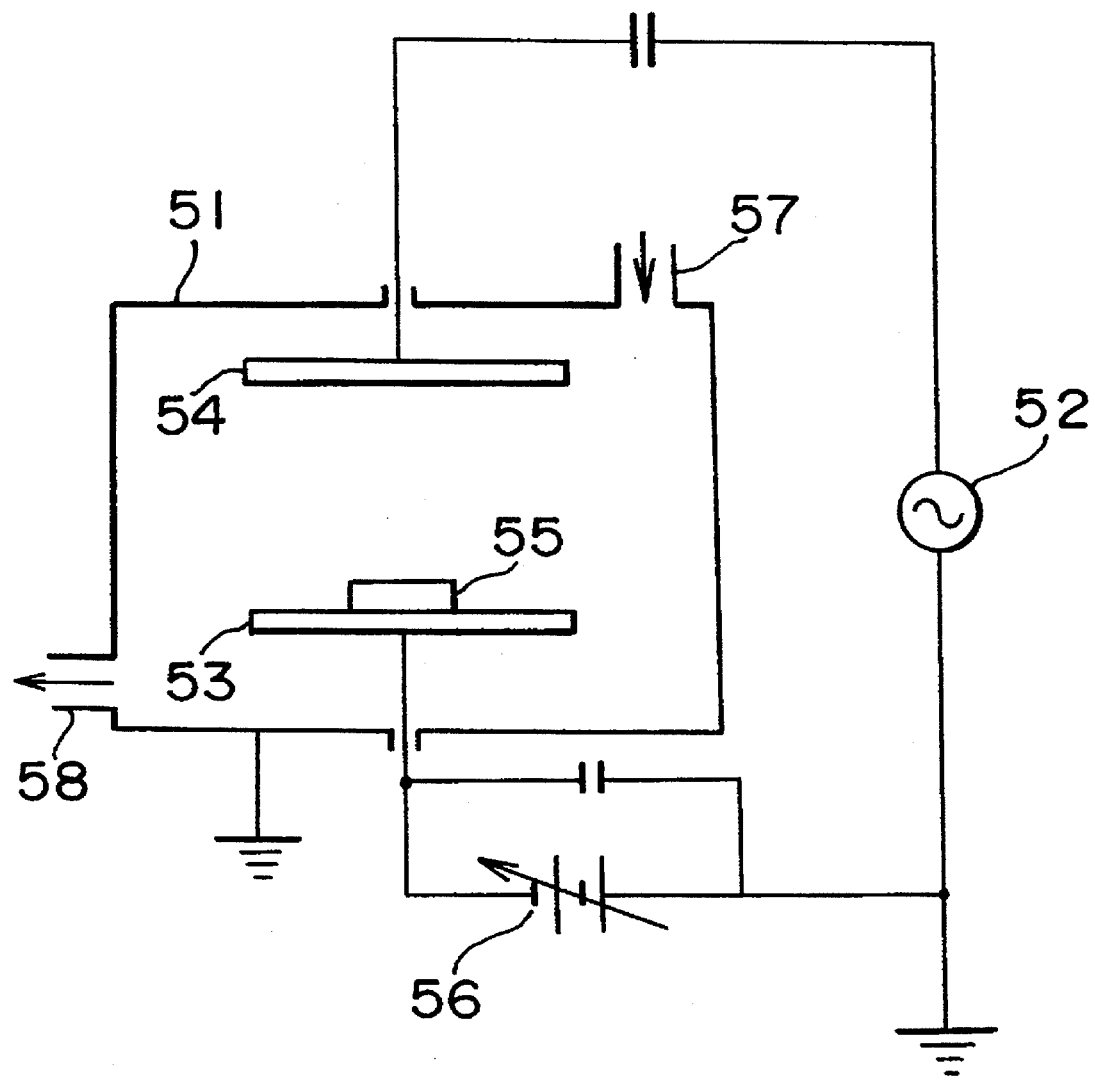
FIG. 2 is a schematic diagram of a bias-applied ionization chemical vapor deposition (CVD) apparatus for use in the present invention.

For the formation of an intermediate layer the bias-applied plasma CVD process as represented by a schematic diagram in FIG. 2 may be used in place of the ionization evaporation so far described. An apparatus for use with the process is shown by way of example. The numeral 51 indicates a chamber, 52 an RF power supply, 53 a substrate electrode, 54 an RD electrode, 55 a substrate to be protectively coated, 56 a variable DC bias supply for applying a bias voltage between the electrodes 53 and 54, 57 an inlet for feed gas, and 58 an evacuation outlet. The gap between the electrodes is, e.g., about 4 cm. The bias voltage that may be used may, e.g., range from −50 V to −5 kV. The RF power may, e.g., be between 50 W and 2 kW, and the reaction time between 10 and 60 minutes. The amorphous silicon-carbon mixture of the intermediate layer can realize a Vickers hardness ranging from 300 to 2500 $kg/mm^2$.

The present invention is illustrated by the following examples.

EXAMPLES

Example 1

Using $Si_2H_6$ and $CH_4$ as materials and by means of the ionization evaporation apparatus of FIG. 1, intermediate layers were formed on the substrates of articles shown in Table 1 (quartz glass "SUPRASL", the trade designation of a Shin-Etsu Quartz product, and SKS2 and SKD11, both of which are hardened steels). Diamond-like thin films were then formed, one for each, on those intermediate layers.

The filament unit 34 in this case consisted of a coiled filament 3 mm wide, and the gap between the filament and the surrounding electrode 36 was fixed to 8 mm. The grid 33 was vibrated at the rate of 5 mm/min.

The intermediate layers were formed under the conditions of If=25A, Va=−500V, Vd=−30V, and the magnetic flux density of the solenoid=400 G. An x-ray analysis revealed no peak, indicating that the intermediate layers were amorphous.

The feed was changed over to $CH_4$ and a 3.0 μm-thick diamond-like thin film was obtained under the conditions of If=25A, Va=−900V, Vd=−30V, and the magnetic flux density of the solenoid=400 G.

Example 2

Intermediate layers were formed from $Si_2H_6$ and $CH_4$ by means of the bias-applied plasma CVD apparatus shown in FIG. 2, under the conditions of bias voltage=−250V, flow rate=60 ($cm^3min^{-1}$), total pressure=0,025 Torr, RF power= 500 W, reaction time=10 min., substrate temperature=200° C., electrode spacing=4.0 cm. No peak was detected by an x-ray analysis, and the intermediate layers were found amorphous.

Next, a diamond-like film was formed on each intermediate layer by ionization evaporation in the manner described in Example 1.

Example 3

Intermediate layers and diamond-like thin film were formed, in succession, from $(CH_3)SiH$ in the same way as in Example 1. The intermediate layers so formed were amorphous.

Example 4

Intermediate layers and diamond-like thin film were formed, in succession, from (CH$_3$)SiH in the same way as in Example 2. The intermediate layers were amorphous.

Comparative Example 1

SiC intermediate layers were formed from SiCl$_4$, CH$_4$, H$_2$, and Ar by the plasma CVD process. They were found crystalline upon x-ray analysis. A diamond-like thin film was formed on each intermediate layer in conformity with Example 1.

Comparative Example 2

Intermediate layers were formed by RF sputtering, using an Si$_3$N$_4$ target in Ar gas. An x-ray analysis showed they were amorphous. Next, in accordance with Example 1 a diamond-like thin film was formed on each intermediate layer.

The properties of the protective films formed on the articles thus obtained are given in Table 1.

The adhesion strength and scratch hardness values were evaluated as follows.

The adhesion strength was determined by bonding a test diamond-like thin film with epoxy resin to a square bar 1 cm$^2$ by 10 cm long and then peeling the film from the bar on a tensile tester (trade-named "Tensilon"). The scratch hardness was determined by means of a Scratch Tester, Model CSR-02 manufactured by Rhesca. The values are relative to the standard values given in the first row of Table 1.

Also, the number of shots endurable for each of metallic molds of hardened steel SKD11 in molding ferrite cores 20 mm in diameter was measured. The results are shown in Table 2.

TABLE 2

| Example | Intermediate layer material | Film forming method | Film thickness μm | Diamond-like thin film μm | No. of shots endurable for mold |
|---|---|---|---|---|---|
| Ex. 1 | Si$_2$H$_6$ + CH$_4$ | Ionization evaporation | 0.05 | 3 | 80,000 |
| Ex. 2 | Si$_2$H$_6$ + CH$_4$ | Bias-applied plasma CVD | 0.10 | 3 | 70,000 |
| Ex. 3 | (CH$_3$)$_3$SiH | Ionization evaporation | 4.0 | 3 | 50,000 |
| Ex. 4 | CH$_3$SiH$_3$ | Bias-applied plasma CVD | 0.005 | 3 | 40,000 |
| Comp. Ex. 1 | SiC | Plasma CVD | 0.05 | 3 | 9,000 |
| Comp. Ex. 2 | Si$_3$N$_4$ | Sputtering | 0.10 | 3 | 8500 |

The intermediate layer according to the invention which is formed from an amorphous mixture of silicon and carbon makes it possible to apply a diamond-like thin film to the substrates of molds and other articles normally difficult to bind with it and thereby substantially improve the durability of the articles. Interlayers of a crystalline mixture of silicon and carbon or of an amorphous mixture of silicon and a substance other than carbon as exemplified by Comparative Examples 1 and 2, respectively, are unable to attain improved adhesive strength.

TABLE 1

| | Intermediate layer | | | | Quartz glass | | | SKD11 | | | SKS2 | | |
|---|---|---|---|---|---|---|---|---|---|---|---|---|---|
| Example | Intermediate layer material | Film forming method | Film thickness μm | Diamond-like thin film μm | Adhesion str. | Scratch hardness | Hardness Hv | Adhesion str. | Scratch hardness | Hardness Hv | Adhesion str. | Scratch hardness | Hardness Hv |
| Ex. 1 | Si$_2$H$_6$ + CH$_4$ | Ionization evaporation | 0.05 | 3 | 1.0 | 1.0 | 6050 | 1.0 | 1.0 | 6000 | 1.0 | 1.0 | 6050 |
| Ex. 2 | Si$_2$H$_6$ + CH$_4$ | Bias-applied plasma CVD | 0.10 | 3 | 1.0 | 1.0 | 6000 | 1.0 | 1.0 | 6100 | 1.0 | 1.0 | 6000 |
| Ex. 3 | (CH$_3$)$_3$SiH | Ionization evaporation | 4.0 | 3 | 1.0 | 0.9 | 6100 | 0.9 | 1.0 | 6000 | 1.0 | 0.9 | 6100 |
| Ex. 4 | CH$_3$SiH$_3$ | Bias-applied plasma CVD | 0.005 | 3 | 0.8 | 0.7 | 5900 | 0.8 | 0.8 | 5800 | 0.8 | 0.7 | 5900 |
| Comp. Ex. 1 | SiCl$_4$, CH$_4$, H$_2$, AR | Plasma CVD | 0.05 | 3 | 0.2 | 0.15 | 4000 | 0.2 | 0.2 | 4100 | 0.2 | 0.2 | 4000 |
| Comp. Ex. 2 | Si$_3$N$_4$ | Sputtering | 0.10 | 3 | 0.1 | 0.1 | 3600 | 0.1 | 0.1 | 3500 | 0.1 | 0.1 | 3600 |

What is claimed is:

1. A protectively coated article which comprises a substrate of a material selected from the group consisting of alloys containing at least Co, Ni or Fe, ceramics, and glass and which has only a slight affinity for a diamond-like thin film, an intermediate layer consisting of an amorphous mixture of silicon and carbon and formed on the substrate and having a thickness of 0.02 to 3.0 µm, and a diamond-like thin film consisting of amorphous carbon having a Raman's absorption at about 1,550 $cm^{-1}$ but not having a sharp peak at 1,333 $cm^{-1}$ formed further thereon.

2. The article according to claim 1, wherein the diamond-like thin film has been formed on the substrate with the substrate at less than 600° C.

3. The article of claim 1 or 2 in which the substrate is a metallic mold constructed of a hardened steel.

4. The article of claim 1 or 2 in which the intermediate layer is formed by a bias-applied plasma chemical vapor deposition (CVD) or ionization evaporation.

5. The article of claim 1 or 2 in which the intermediate layer has a thickness of 0.05 to 0.5 µm.

6. The article of claim 1 or 2 in which the silicon concentration in the intermediate layer decreases gradually from the side facing the substrate toward the diamond-like film while the carbon concentration increases from the side facing the substrate toward the diamond-like thin film.

7. The article according to claim 1, wherein the article is at least one of a mold and a die.

8. The article according to claim 7, wherein the intermediate layer is formed by a bias-applied plasma vapor deposition or ionization evaporation.

9. The article according to claim 7 or 8, wherein the intermediate layer has a thickness of 0.05 to 0.5 µm.

* * * * *